United States Patent
Lim

(10) Patent No.: US 10,629,791 B2
(45) Date of Patent: Apr. 21, 2020

(54) LIGHT EMITTING DEVICE AND FABRICATING METHOD THEREOF

(71) Applicant: Samsung Display Co., Ltd., Yongin-si, Gyeonggi-do (KR)

(72) Inventor: Bek Hyun Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/144,731

(22) Filed: Sep. 27, 2018

(65) Prior Publication Data

US 2019/0245126 A1 Aug. 8, 2019

(30) Foreign Application Priority Data

Feb. 8, 2018 (KR) ........................ 10-2018-0015888

(51) Int. Cl.
| | |
|---|---|
| H01L 33/62 | (2010.01) |
| H01L 27/15 | (2006.01) |
| H01L 33/36 | (2010.01) |
| G09G 3/32 | (2016.01) |
| H01L 33/00 | (2010.01) |
| H01L 33/20 | (2010.01) |
| H01L 33/18 | (2010.01) |
| H01L 25/075 | (2006.01) |
| H01L 33/08 | (2010.01) |

(52) U.S. Cl.
CPC ............... *H01L 33/62* (2013.01); *G09G 3/32* (2013.01); *H01L 27/153* (2013.01); *H01L 33/0095* (2013.01); *H01L 33/18* (2013.01); *H01L 33/20* (2013.01); *H01L 33/36* (2013.01); *G09G 2300/0426* (2013.01); *H01L 25/0753* (2013.01); *H01L 33/08* (2013.01); *H01L 2933/0066* (2013.01)

(58) Field of Classification Search
CPC ....... H01L 33/62; H01L 33/36; H01L 27/153; G09G 3/32; G09G 2300/0426
USPC .......................................................... 257/88
See application file for complete search history.

(56) References Cited

U.S. PATENT DOCUMENTS

| | | | |
|---|---|---|---|
| 8,872,214 B2 | 10/2014 | Negishi et al. | |
| 9,112,112 B2 | 8/2015 | Do et al. | |
| 9,773,761 B2 | 9/2017 | Do | |
| 10,026,777 B2 | 7/2018 | Kang et al. | |
| 2011/0089850 A1 | 4/2011 | Shibata et al. | |

(Continued)

FOREIGN PATENT DOCUMENTS

| | | |
|---|---|---|
| KR | 10-1244926 B1 | 3/2013 |
| KR | 10-1490758 B1 | 2/2015 |

(Continued)

*Primary Examiner* — Tong-Ho Kim
(74) *Attorney, Agent, or Firm* — Lewis Roca Rothgerber Christie LLP

(57) ABSTRACT

A light emitting device includes: a substrate; a first electrode on the substrate; a metal member on the first electrode and having a cavity; a first insulating layer on the metal member and exposing the cavity therethrough; a bar-type LED having a first end portion and a second end portion; and a second electrode on the first insulating layer. The first end portion of the bar-type LED is in the cavity and electrically connected to the first electrode, and the second end portion of the bar-type LED protrudes outside of the cavity and is electrically connected to the second electrode.

20 Claims, 15 Drawing Sheets

(56) References Cited

U.S. PATENT DOCUMENTS

2018/0026074 A1* 1/2018 Lee .................... H01L 25/0753
362/219
2018/0175106 A1 6/2018 Kim et al.

FOREIGN PATENT DOCUMENTS

| KR | 10-2018-0071465 A | 6/2018 |
| KR | 10-2018-0072909 A | 7/2018 |

* cited by examiner

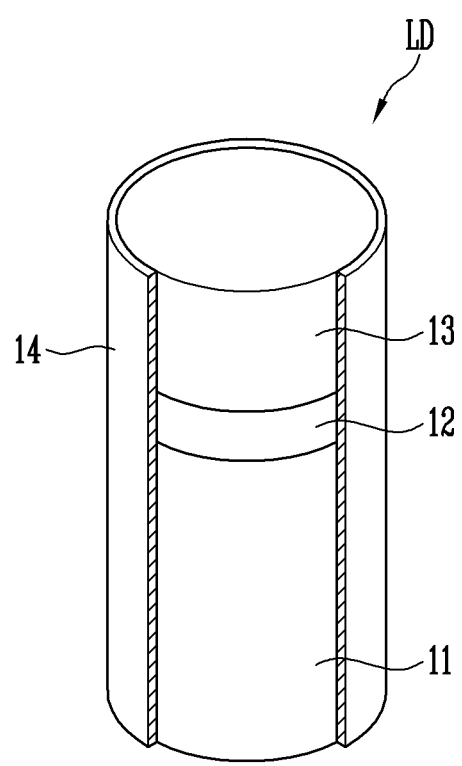

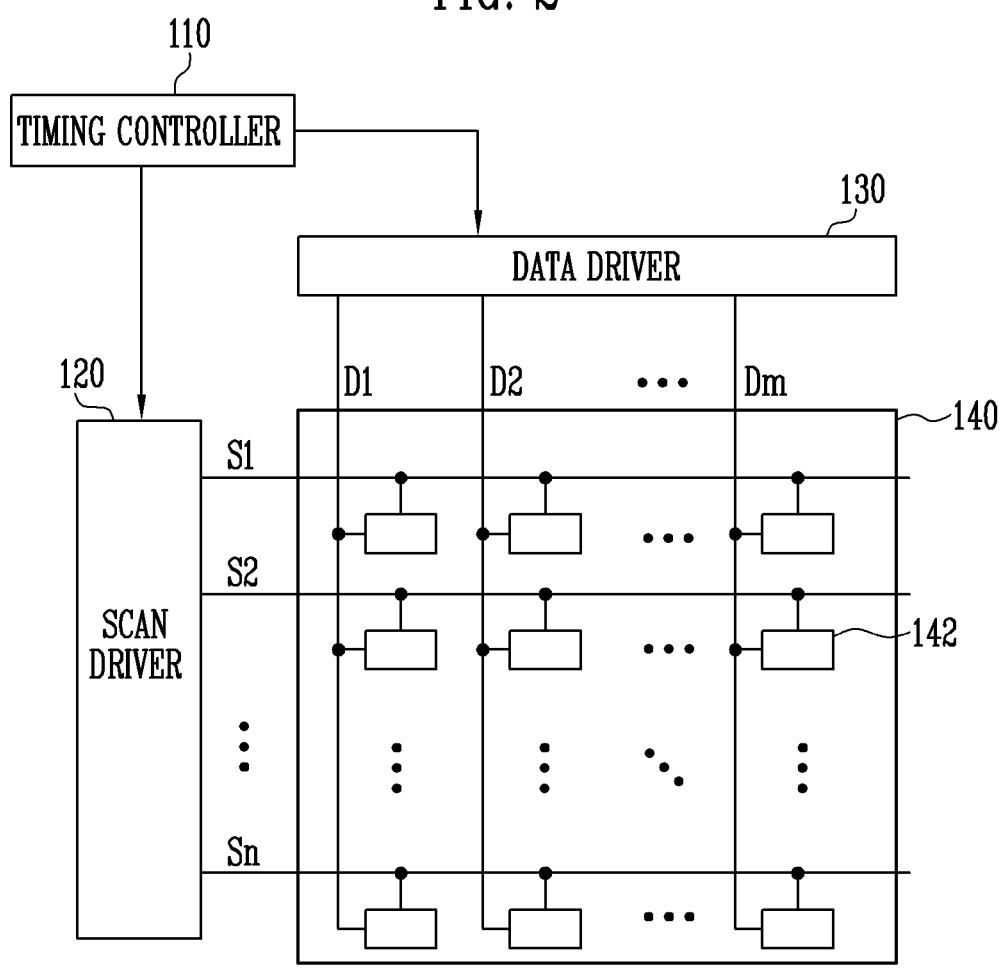

LIGHT EMITTING DEVICE AND FABRICATING METHOD THEREOF

CROSS-REFERENCE TO RELATED APPLICATION

This application claims priority to and the benefit of Korean patent application 10-2018-0015888, filed on Feb. 8, 2018 in the Korean Intellectual Property Office (KIPO), the entire disclosure of which is incorporated herein by reference.

BACKGROUND

1. Field

Aspects of the present disclosure relate to a light emitting device and a fabricating method thereof.

2. Related Art

Light emitting diodes (hereinafter abbreviated as LEDs) exhibit relatively satisfactory durability even in poor environmental conditions and have excellent performance in terms of lifespan and luminance. Recently, studies for applying LEDs to various light emitting devices have been actively conducted.

A technique for fabricating a bar-type LED on a micro or nano scale (e.g., a micro bar-type LED) by using an inorganic crystal structure, such as a structure in which a nitride-based semiconductor is grown, has been studied. For example, the bar-type LED may be fabricated in a size small enough to constitute a pixel of a self-luminescent display panel and the like.

SUMMARY

Embodiments of the present disclosure provide a light emitting device that includes a bar-type LED and has uniform or substantially uniform luminance characteristics and a fabricating method of the light emitting device.

According to an embodiment of the present disclosure, a light emitting device includes: a substrate; a first electrode on the substrate; a metal member on the first electrode and having a cavity; a first insulating layer on the metal member and exposing the cavity therethrough; a bar-type LED having a first end portion and a second end portion; and a second electrode on the first insulating layer. The first end portion of the bar-type LED is in the cavity and electrically connected to the first electrode, and the second end portion of the bar-type LED protrudes outside of the cavity and is electrically connected to the second electrode.

A width of an inside portion of the cavity may be larger than a width of an entrance to the cavity.

A thickness of the metal member may be less than a length of the bar-type LED.

The cavity in the metal member may expose the first electrode.

The light emitting device may further include a plurality of bar-type LEDs in the cavity.

The first insulating layer may have an inclined surface inclined with respect to the cavity, and the bar-type LED may lean obliquely onto the inclined surface of the first insulating layer.

One pixel region may include a plurality of bar-type LEDs, and the bar-type LEDs in the one pixel region may be inclined in the same direction.

One pixel region may include a plurality of bar-type LEDs, and the bar-type LEDs in the one pixel region may be inclined in directions different from each other.

The light emitting device may further include a connecting member between the first end portion of the bar-type LED in the cavity and the first electrode.

The light emitting device may further include a second insulating layer between the first insulating layer and the second electrode. The second insulating layer may have a contact opening at where the second end portion of the bar-type LED and the second electrode are electrically connected to each other.

The light emitting device may further include alignment lines at both sides of the first electrode.

According to another embodiment of the present disclosure, a method of fabricating a light emitting device includes: forming a first electrode on a substrate; forming a metal member on the first electrode; forming a first insulating layer over the metal member, removing a portion of the first insulating layer to expose the metal member; forming an cavity in the metal member; arranging a bar-type LED such that a first end portion of the bar-type LED is in the cavity and electrically connected to the first electrode; and forming a second electrode on the first insulating layer, the second electrode being electrically connected to a second end portion of the bar-type LED.

The cavity in the metal member may have a shape in which a width of its inside portion is greater than a width of its entrance.

The cavity may be formed by isotropic etching.

A thickness of the metal member may be less than a length of the bar-type LED.

The first insulating layer may have an inclined surface inclined with respect to the cavity, and the bar-type LED may lean obliquely onto the inclined surface of the first insulating layer.

The arranging of the bar-type LED may include: providing an LED solution comprising a plurality of bar-type LEDs on the first insulating layer; and after the providing the LED solution, cleaning the substrate in one direction.

The method may further include forming a connecting member between the first end portion of the bar-type LED that is in the cavity and the first electrode.

The forming of the connecting member may include: forming a connecting member layer on the first insulating layer and in the cavity; and etching the connecting member layer such that a portion of the connecting member layer remains in the cavity.

The method may further include forming a second insulating layer having a contact opening on the first insulating layer. The second end portion of the bar-type LED and the second electrode may be electrically connected to each other at the contact opening.

BRIEF DESCRIPTION OF THE DRAWINGS

Example embodiments of the present disclosure will now be described more fully hereinafter with reference to the accompanying drawings; however, the present disclosure may be embodied in different forms and should not be construed as limited to the example embodiments set forth herein. Rather, these embodiments are provided so that this disclosure will be thorough and complete and will fully convey the scope of the present disclosure to those skilled in the art.

In the figures, dimensions may be exaggerated for clarity of illustration. Like reference numerals refer to like elements throughout.

FIG. 1 is a perspective view illustrating a bar-type LED according to an embodiment of the present disclosure.

FIG. 2 is a structural diagram illustrating a light emitting device according to an embodiment of the present disclosure.

DETAILED DESCRIPTION

Figure 3A:
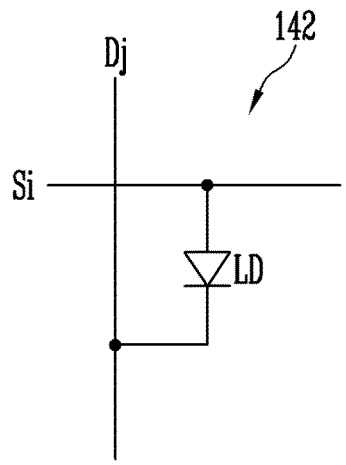
FIGS. 3A-3E are circuit diagrams illustrating a unit region of the light emitting device in a passive light emitting display panel according to embodiments of the present disclosure.

The present disclosure may include various changes and different shapes; therefore, only example embodiments are described herein. However, these example embodiments do not limit the present disclosure and cover all changes and equivalent materials and replacements within the scope of the present disclosure.

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the present disclosure. As used herein, the singular forms are intended to include the plural forms as well, unless the context clearly indicates otherwise.

It will be further understood that the terms "comprises," "comprising," "includes," "including", and/or "having," and variations thereof, when used in this specification, specify the presence of stated features, integers, steps, operations, elements, and/or components but do not preclude the presence and/or addition of one or more other features, integers, steps, operations, elements, components, and/or groups thereof. Further, an expression that an element, such as a layer, region, substrate or plate, is placed "on" or "above" another element indicates not only a case where the element is placed "directly on" or "just above" the other element but also a case where a further element is interposed between the element and the other element. An expression that an element, such as a layer, region, substrate or plate, is placed "beneath" or "below" another element indicates not only a case where the element is placed "directly beneath" or "just below" the other element but also a case where a further element is interposed between the element and the other element.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. Hereinafter, exemplary embodiments of the present disclosure will be described in detail with reference to the accompanying drawings.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

According to an embodiment of the present disclosure, a light emitting device including a bar-type LED LD is provided. A bar-type LED LD will first be described, and a light emitting device including the bar-type LED LD will then be described.

FIG. 1 is a perspective view illustrating a bar-type LED LD according to an embodiment of the present disclosure. A cylindrical bar-type LED LD is illustrated in FIG. 1, but the present disclosure is not limited thereto.

Referring to FIG. 1, the bar-type LED LD according to an embodiment of the present disclosure includes first and second conductive semiconductor layers 11 and 13 and an active layer 12 interposed between the first and second conductive semiconductor layers 11 and 13. For example, the bar-type LED LD may have a stacked structure in which the first conductive semiconductor layer 11, the active layer 12, and the second conductive semiconductor layer 13 are sequentially stacked. In some embodiments, the bar-type LED LD may further include an insulating film 14. The bar-type LED LD may further include a first electrode and a second electrode.

In an embodiment of the present disclosure, the bar-type LED LD has a bar shape extending in one direction. When it is assumed that the extending direction of the bar-type LED LD is a length direction, the bar-type LED LD has a first end portion and a second end portion along the length direction. In an embodiment of the present disclosure, one of the first and second conductive semiconductor layers 11 and 13 is disposed at the first end portion, and the other of the first and second conductive semiconductor layers 11 and 13 is disposed at the second end portion.

In some embodiments, the bar-type LED LD may have a cylindrical shape as shown in FIG. 1, but the shape of the bar-type LED LD is not limited thereto. Here, the term "bar-type" includes a rod-like shape or bar-like shape, which is long in its length direction (e.g., has an aspect ratio greater than about 1), such as a cylindrical column or a polygonal column. For example, the bar-type LED LD may have a length that is greater than its diameter.

The bar-type LED LD may be fabricated small enough to have a diameter and/or a length measured on a micro or nano scale. However, the size of the bar-type LED LD is not limited thereto. For example, the size of the bar-type LED LD may be modified to correspond to conditions of a light emitting device to which the bar-type LED LD is to be applied.

The first conductive semiconductor layer 11 may include, for example, an n-type semiconductor layer. For example, the first conductive semiconductor layer 11 may include at least one semiconductor material from among indium aluminum gallium nitride (InAlGaN), gallium nitride (GaN), aluminum gallium nitride (AlGaN), indium gallium nitride (InGaN), aluminum nitride (AlN), and indium nitride (InN) and may include a semiconductor layer doped with a first conductive dopant, such as silicon (Si), germanium (Ge), or tin (Sn). The first conductive semiconductor layer 11 is not limited thereto, however, and the first conductive semiconductor layer 11 may include various suitable materials.

The active layer 12 is formed on the first conductive semiconductor layer 11 and may have a single or multiple quantum well structure. In some embodiments, a clad layer doped with a conductive dopant may be formed on the top and/or the bottom of (e.g., on opposite ends of) the active layer 12. For example, the clad layer may be implemented as an AlGaN layer or an InAlGaN layer. In addition, the active layer 12 may include (or may be made of) a material, such as AlGaN or indium gallium aluminum nitride (InGaAlN). When an electric field having a threshold voltage or greater (e.g., a predetermined voltage or greater) is applied to both ends of the bar-type LED, electron-hole pairs are combined in the active layer 12 such that the bar-type LED emits light.

The second conductive semiconductor layer 13 is formed on the active layer 12 and may include a semiconductor layer of a type different from that of the first conductive semiconductor layer 11. As an example, the second conductive semiconductor layer 13 may include a p-type semiconductor layer. For example, the second conductive semiconductor layer 13 may include at least one semiconductor material from among InGaAlN, GaN, AlGaN, InGaN, AlN, and indium nitride (InN), and may include a semiconductor layer doped with a second conductive dopant, such as magnesium (Mg). The second conductive semiconductor layer 13 is not limited thereto, however, and the second conductive semiconductor layer 13 may include various suitable materials.

In some embodiments, the bar-type LED LD may further include the insulating film 14, but the present disclosure is not limited thereto. In some embodiments, the insulating film 14 may be omitted.

In some embodiments, the insulating film 14 may be provided to cover at least one region of the first conductive semiconductor layer 11, the active layer 12, and the second conductive semiconductor layer 13. For example, the insulating film 14 may be provided at a portion other than the end portions of the bar-type LED LD so that the end portions of the bar-type LED LD are exposed. Also, in some embodiments, the insulating film 14 may expose at least one region of the side surface of the first conductive semiconductor layer 11 and/or the second conductive semiconductor layer 13.

The insulating film 14 may be formed to surround at least a portion of outer peripheral surfaces (e.g., outer circumferential surfaces) of the first conductive semiconductor layer 11, the active layer 12, and/or the second conductive semiconductor layer 13. As an example, the insulating film 14 may be formed to surround at least the outer peripheral surface of the active layer 12. In some embodiments, the insulating film 14 may be formed of a transparent insulating material. For example, the insulating film 14 may include at least one insulating material selected from the group consisting of silicon oxide (e.g., $SiO_2$), silicon nitride (e.g., $Si_3N_4$), aluminum oxide (e.g., $Al_2O_3$), and titanium oxide (e.g., $TiO_2$). However, the present disclosure is not limited thereto and various suitable materials having insulating properties may be used.

The above-described bar-type LED LD may be used as a light emitting source for various light emitting devices. As an example, the bar-type LED LD may be used as a light emitting source for lighting devices or self-luminescent display panels.

FIG. 2 is a structural diagram illustrating a light emitting device according to an embodiment of the present disclosure. In FIG. 2, a light emitting display device is illustrated as an example of a light emitting device using bar-type LEDs LD, but the light emitting device according to the present disclosure is not limited to the light emitting display device illustrated in FIG. 2. As an example, the light emitting device according to the present disclosure may be another type of light emitting device, such as a lighting device.

Referring to FIG. 2, the light emitting device according to an embodiment of the present disclosure includes a timing controller 110, a scan driver 120, a data driver 130, and a light emitting unit 140. When the light emitting device is a light emitting display device, as in the illustrated embodiment, the light emitting unit 140 may be a pixel region of a display panel.

The timing controller 110 receives various control signals and image data, which drive the light emitting unit 140, from the outside (e.g., from a system for transmitting image data). The timing controller 110 realigns the received image data and transmits the realigned image data to the data driver 130. Also, the timing controller 110 generates scan control signals and data control signals, which are used to drive the respective scan and data drivers 120 and 130, and transmits the generated scan and data control signals to the respective scan and data drivers 120 and 130.

The scan driver 120 receives a scan control signal supplied from the timing controller 110 and generates a scan signal corresponding to the scan control signal. The scan signal generated by the scan driver 120 is supplied to unit regions (e.g., pixels or pixel regions) 142 through scan lines S1 to Sn.

The data driver 130 receives a data control signal and image data, which are supplied from the timing controller 110, and generates a data signal corresponding to the data control signal and the image data. The data signal generated by the data driver 130 is output to data lines D1 to Dm. The data signal output to the data lines D1 to Dm is input to pixels 142 on a horizontal pixel line, which are selected by the scan signal.

The light emitting unit 140 may include a plurality of pixels 142 connected to the scan lines S1 to Sn and the data lines D1 to Dm. In some embodiments, each of the pixels 142 may include one or more of the bar-type LEDs LD shown in FIG. 1. The pixels 142 selectively emit light corresponding to a data signal input from the data lines D1 to Dm when a scan signal is supplied from the scan lines S1 to Sn. As an example, each of the pixels 142 may emit light having a luminance corresponding to the input data signal during each frame period. A pixel 142 supplied with a data signal corresponding to a black luminance does not emit light during the corresponding frame period, thereby providing black. When the light emitting unit 140 is a pixel unit of an active light emitting display panel, the light emitting unit 140 may be driven by being further supplied with first and second pixel power sources as well as the scan and data signals.

FIGS. 3A-3E are circuit diagrams illustrating a unit region of the light emitting device according to an embodiment of the present disclosure and illustrate examples of a pixel of a passive light emitting display panel. For convenience, a jth (j is a natural number) pixel on an ith (i is a natural number) horizontal pixel line is illustrated in FIGS. 3A-3E. As a non-restrictive example related to the pixel shown in FIGS. 3A-3E, the pixel may be one of red, green, blue, and white pixels.

Referring to FIG. 3A, the pixel 142 includes a bar-type LED LD connected between a scan line Si and a data line Dj. In some embodiments, a first electrode (e.g., an anode electrode) of the bar-type LED LD may be connected to the scan line Si, and a second electrode (e.g., a cathode electrode) of the bar-type LED LD may be connected to the data line Dj. When a voltage equal to or greater than a threshold voltage is applied between the first electrode and the second electrode, the bar-type LED LD emits light having a luminance corresponding to the magnitude of the applied voltage. For example, the light emission of the pixel 142 can be controlled by adjusting the voltage of a scan signal applied to the scan line Si and/or a data signal applied to the data line Dj.

Figure 3B:
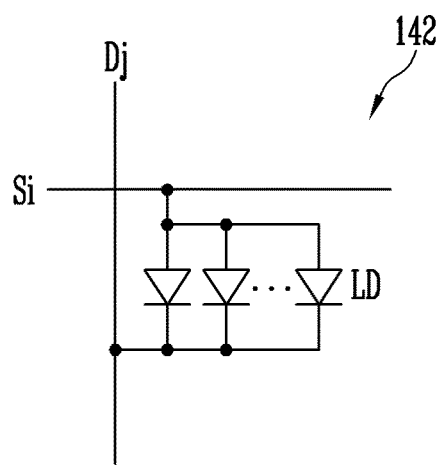

Referring to FIG. 3B, the pixel 142 may include a plurality of bar-type LEDs LD connected in parallel. In this embodiment, the luminance of the pixel 142 may correspond to the sum of brightnesses of the plurality of LEDs LD in the pixel 142. When the pixel 142 includes a plurality of bar-type LEDs LD, including a relatively large number of bar-type LEDs LD, although a defect occurs in some of the bar-type LEDs LD, the defect may not cause a defect (e.g., may not cause a noticeable defect) of the pixel 142 itself.

Figure 3C:
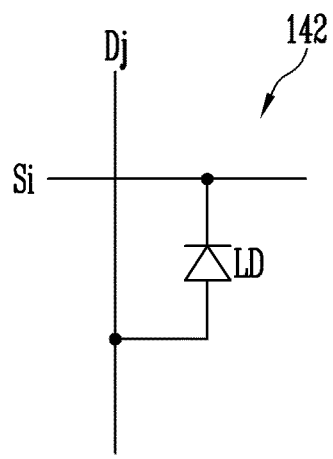

Referring to FIG. 3C, the connecting direction of the bar-type LEDs LD provided in the pixel 142 may be changed. As an example, the first electrode (e.g., the anode electrode) of the bar-type LED LD may be connected to the data line Dj, and the second electrode (e.g., the cathode electrode) of the bar-type LED LD may be connected to the scan line Si. The direction of a voltage applied between the scan line Si and the data line Dj in the embodiment shown in FIG. 3A and the direction of a voltage applied between the scan line Si and the data line Dj in the embodiment shown in FIG. 3C may be opposite to each other.

Figure 3D:
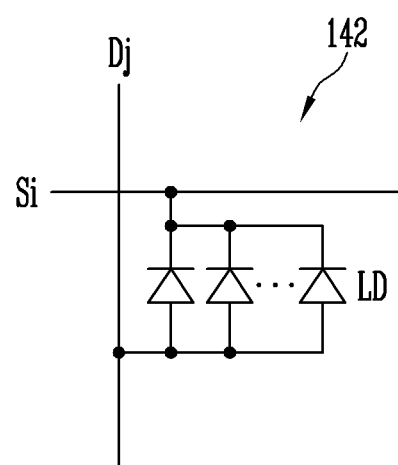

Referring to FIG. 3D, the pixel 142 may also include a plurality of bar-type LEDs LD connected in parallel.

Figure 3E:
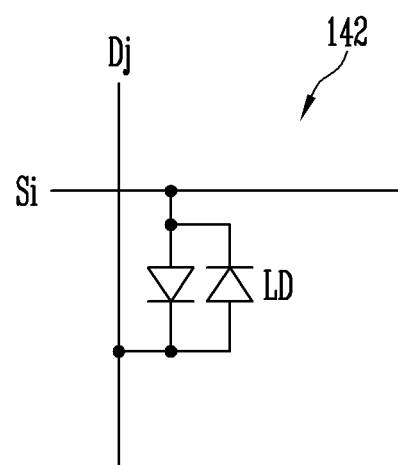

Referring to FIG. 3E, the pixel 142 may include a plurality of bar-type LEDs LD connected in different directions. As an example, the pixel 142 may include a bar-type LED LD having the first electrode (e.g., the anode electrode) connected to the scan line Si and the second electrode (e.g., the cathode electrode) connected to the data line Dj, and another bar-type LED LD having the first electrode (e.g., the anode electrode) connected to the data line Dj and the second electrode (e.g., the cathode electrode) connected to the scan line Si.

The pixel 142 shown in FIG. 3E may be DC driven or AC driven (e.g., may be driven by an AC current or a DC current). When the pixel 142 shown in FIG. 3E is DC driven, forward connected bar-type LEDs LD may emit light and reverse connected LEDs LD may not emit light. When the pixel 142 shown in FIG. 3E is AC driven, forward connected bar-type LEDs LD may emit light according to the direction of an applied voltage. For example, when the pixel 142 shown in FIG. 3E is AC driven, the bar-type LEDs LD included in the pixel 142 may alternately emit light according to the direction of the applied voltage.

Figure 4A:
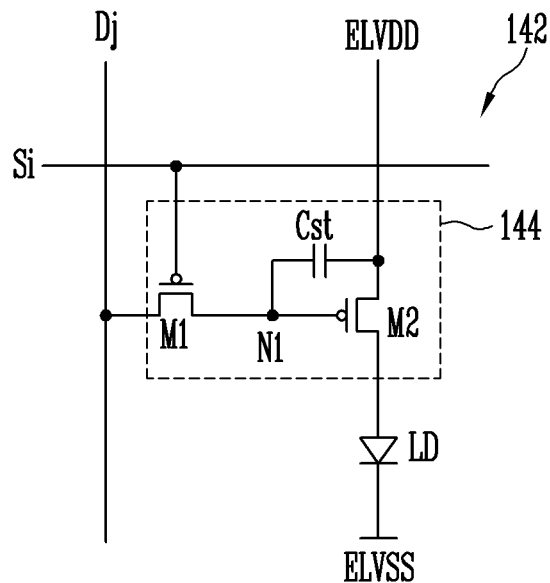
FIGS. 4A-4C are circuit diagrams illustrating a unit region of the light emitting device in an active light emitting display panel according to embodiments of the present disclosure.
Figure 4B:
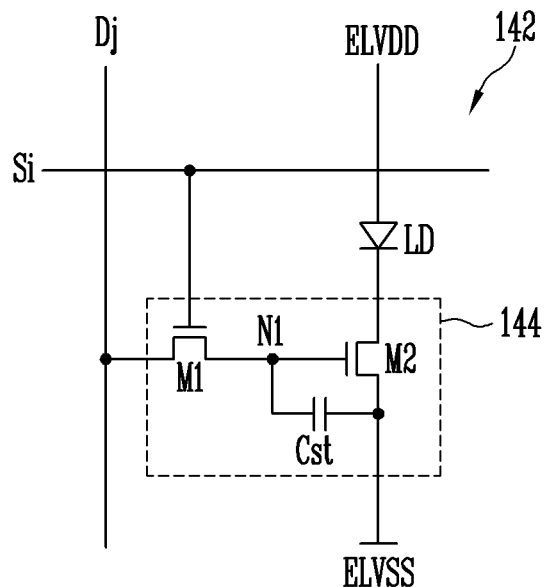
Figure 4C:
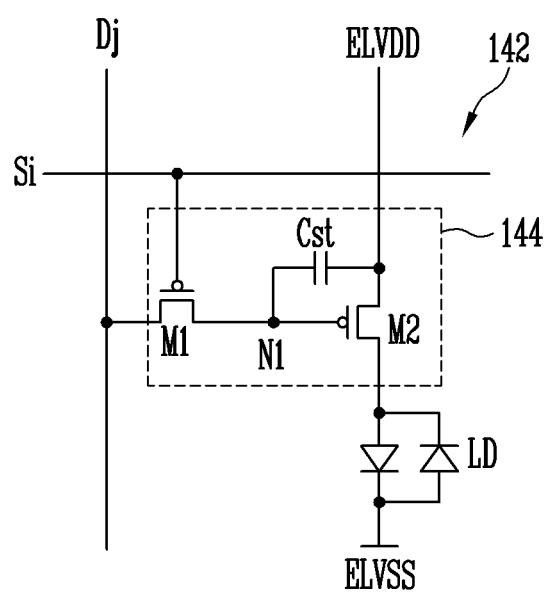

FIGS. 4A-4C are circuit diagrams illustrating a unit region of a light emitting device according to embodiments of the present disclosure and illustrate examples of a pixel of an active light emitting display panel. In FIGS. 4A-4C, components similar or identical to those shown in FIGS. 3A-3E are designated by like reference numerals and detailed descriptions thereof may be omitted.

Referring to FIG. 4A, the pixel 142 includes a bar-type LED LD and a pixel circuit 144 connected thereto.

A first electrode (e.g., an anode electrode) of the bar-type LED LD is connected to a first pixel power source ELVDD via the pixel circuit 144, and a second electrode (e.g., a cathode electrode) of the bar-type LED LD is connected to a second pixel power source ELVSS. The first pixel power source ELVDD and the second pixel power source ELVSS may have potentials different from each other. As an example, the second pixel power source ELVSS may have a potential lower by a threshold voltage or more of the bar-type LED LD than that of the first pixel power source ELVDD. Each bar-type LED LD emits light having a luminance corresponding to a driving current controlled by the pixel circuit 144.

Although an embodiment in which the pixel 142 includes only one bar-type LED LD is disclosed in FIG. 4A, the present disclosure is not limited thereto. For example, the pixel 142 may include a plurality of bar-type LEDs LD connected in parallel.

In some embodiments, the pixel circuit 144 may include first and second transistors M1 and M2 and a storage capacitor Cst. However, the structure of the pixel circuit 144 is not limited to the embodiment shown in FIG. 4A.

A first electrode of the first transistor (e.g., a switching transistor) M1 is connected to a data line Dj, and a second electrode of the first transistor M1 is connected to a first node N1. Here, the first and second electrodes of the first transistor M1 are different electrodes. For example, when the first electrode is a source electrode, the second electrode is a drain electrode. In addition, a gate electrode of the first transistor M1 is connected to a scan line Si. The first transistor M1 is turned on when a scan signal having a voltage (e.g., a low-level gate-on voltage) at which the first transistor M1 can be turned on is supplied from the scan line Si to allow the data line Dj and the first node N1 to be electrically connected to each other. At this time, a data signal of a corresponding frame is supplied to the data line Dj. Accordingly, the data signal is transferred to the first node N1. The data signal transferred to the first node N1 is charged in the storage capacitor Cst.

A first electrode of the second transistor (e.g., a driving transistor) M2 is connected to the first pixel power source ELVDD, and a second electrode of the second transistor M2 is connected to the first electrode of the bar-type LED LD. In addition, a gate electrode of the second transistor M2 is connected to the first node N1. The second transistor M2 controls an amount of driving current supplied to the bar-type LED LD corresponding to a voltage at the first node N1.

One electrode of the storage capacitor Cst is connected to the first pixel power source ELVDD, and the other electrode of the storage capacitor Cst is connected to the first node N1. The storage capacitor Cst charges a voltage corresponding to the data signal supplied to the first node N1 and maintains the charged voltage until a data signal of a next frame is supplied.

For convenience, the pixel circuit 144 having a relatively simple structure including the first transistor M1 for transferring a data signal to the inside of the pixel 142, the storage capacitor Cst for storing the data signal, and the second transistor M2 for supplying a driving current corresponding to the data signal to the bar-type LED LD is illustrated in FIG. 4A. However, the present disclosure is not limited thereto, and the structure of the pixel circuit 144 may be variously suitably modified and implemented. As an example, the pixel circuit 144 may further include other circuit elements, such as a transistor element for compensating for a threshold voltage of the second transistor M2, a transistor element for initializing a voltage of the first node N1 or a voltage applied to one electrode of the bar-type LED LD, a transistor element for controlling a light emission period, and/or a boosting capacitor for boosting the voltage at the first node N1.

In FIG. 4A, all of the transistors (e.g., both the first and second transistors M1 and M2) in the pixel circuit 144 are illustrated as p-type transistors, but the present disclosure is not limited thereto. For example, at least one of the transistors M1 and M2 included in the pixel circuit 144 may be an n-type transistor.

Referring to FIG. 4B, the first and second transistors M1 and M2 may be n-type transistors. The configuration or operation of the pixel circuit 144 shown in FIG. 4B is similar to that of the pixel circuit 144 shown in FIG. 4A, except that the connection positions of some of the components are changed due to a change in transistor type. Therefore, a more detailed description of the pixel circuit 144 shown in FIG. 4B will be omitted.

Referring to FIG. 4C, the pixel 142 may include a plurality of bar-type LEDs LD connected in different directions. In this embodiment, the pixel 142 may be DC driven or AC driven. This has already been described above with respect to FIG. 3E, and therefore, a more detailed description thereof will be omitted.

Figure 5A:
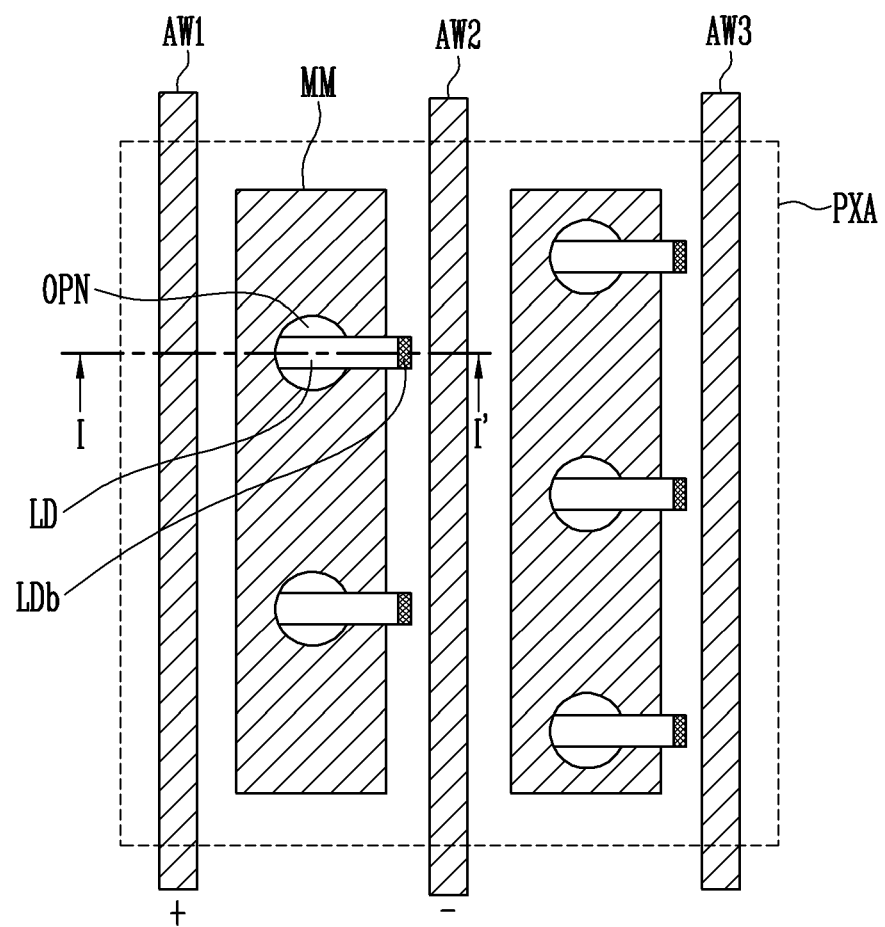
FIG. 5A is a plan view illustrating an individual pixel region of the light emitting device according to an embodiment of the present disclosure.
Figure 5B:
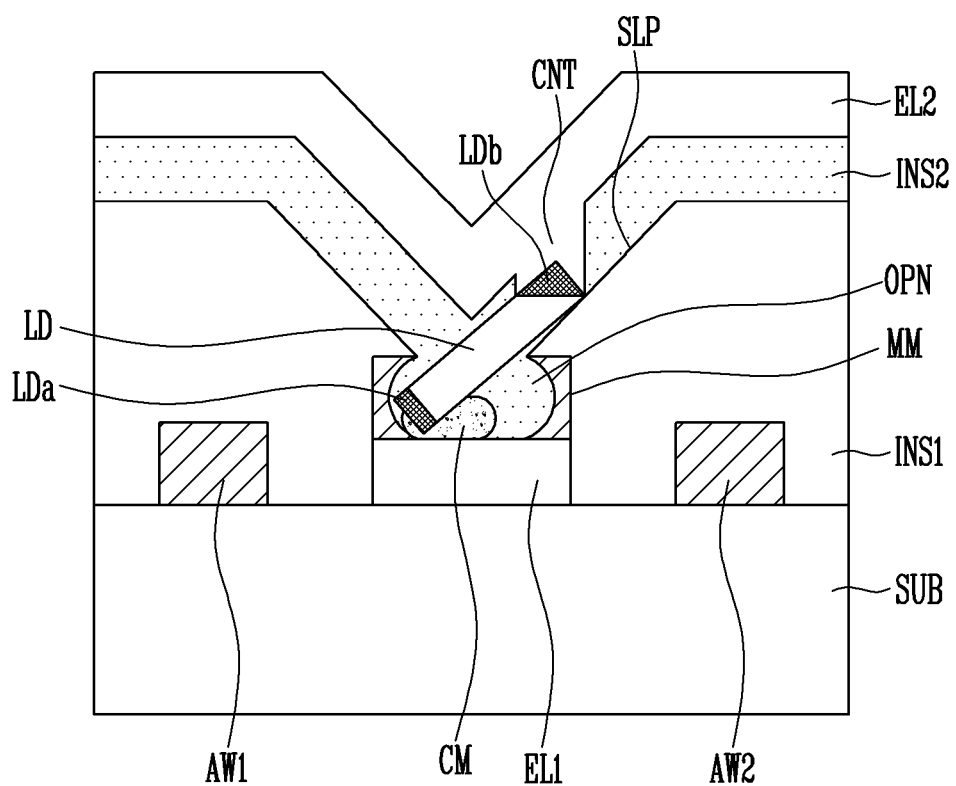
FIG. 5B is a sectional view taken along the line I-I' of FIG. 5A.

FIG. 5A is a plan view illustrating a unit region of the light emitting device according to an embodiment of the present disclosure, and FIG. 5B is a sectional view taken along the line I-I' of FIG. 5A.

The unit region illustrated in FIG. 5A may be, for example, an individual pixel region PXA in which one of the pixels 142 of the light emitting unit 140 shown in FIG. 2 is provided. For example, the light emitting device according to an embodiment of the present disclosure may be a light emitting display device including a plurality of individual pixel regions PXA shown in FIG. 5A, and one of the pixels 142 shown in FIGS. 2-4C may be provided in each pixel region PXA. However, the present disclosure is not limited thereto, and the present disclosure may be applied to other light emitting devices as well as the light emitting display device.

For convenience, an embodiment in which five bar-type LEDs LD are provided is illustrated in FIG. 5, but the present disclosure is not limited thereto. The number and arrangement structure of the bar-type LEDs LD arranged in the pixel region PXA may be variously suitably modified.

The luminance of one pixel region PXA may vary depending on the number of bar-type LEDs LD electrically connected between a first electrode EL1 and a second electrode EL2 (e.g., the luminance of the pixel region PXA may vary based on the number of effective bar-type LEDs LD provided in the pixel region PXA). When a variation in the number of effective bar-type LEDs LD greatly varies between the pixel regions PXA, the light emitting device may exhibit overall non-uniform brightness (or luminous) characteristics.

Thus, in an embodiment of the present disclosure, a metal member MM having openings OPN (e.g., cavities, grooves, or cave parts) is provided on the first electrode EU, and one end portion of each bar-type LED LD is in the opening OPN so that the bar-type LEDs LD are more uniformly arranged (see, e.g., FIG. 5B). According to an embodiment of the present disclosure, it is possible to provide a light emitting device and a fabricating method thereof in which the number of bar-type LEDs LD arranged in each pixel region PXA is uniform or substantially uniform, thereby achieving more uniform luminance characteristics.

Referring to FIGS. 5A and 5B, the light emitting device according to an embodiment of the present disclosure may include a substrate SUB, a first electrode EL1, alignment lines AW1 and AW2, a metal member MM, a first insulating layer INS1, a bar-type LED LD, a connecting member CM, a second insulating layer INS2, and a second electrode EL2.

The substrate SUB may include (or may be made of) an insulative material, such as glass or resin. Also, the substrate SUB may include (or may be made of) a flexible material to be bendable or foldable and may have a single- or multi-layer structure.

For example, the substrate SUB may include at least one of polystyrene, polyvinyl alcohol, poly methyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The substrate SUB may include the transistors of the above-described pixel circuit. For example, the substrate SUB may be a thin film transistor array substrate. In addition, the first electrode EL1 may be electrically connected to a source/drain electrode of the transistor.

The first electrode EL1 is provided on the substrate SUB. The first electrode EL1 may include (or may be made of) a metal. For example, the first electrode EL1 may include at least one of a metal, such as gold (Au), silver (Ag), aluminum (Al), molybdenum (Mo), chromium (Cr), titanium (Ti), nickel (Ni), neodymium (Nd), and copper (Cu), or alloys of these metals. The first electrode EL1 may be formed as a single layer. However, the present disclosure is not limited thereto, and the first electrode EU may be formed as a multi-layer structure in which a plurality of materials from among the metals and the alloys are stacked.

The alignment lines AW1 and AW2 are provided at sides of (e.g., at respective sides of) the first electrode EL1. The alignment lines AW1 and AW2 may be provided in the same layer as the first electrode EL1. The alignment lines AW1 and AW2 may include a first alignment line AW1 provided at one side of the first electrode EL1 and a second alignment line AW2 provided at the other side of the first electrode EL1. Voltages having opposite polarities are respectively applied to the first alignment line AW1 and the second alignment line AW2 so that the bar-type LED LD is deflected in one direction and thereby aligned.

The alignment lines AW1 and AW2 may be formed of the same material as the metal member MM. The alignment lines AW1 and AW2 may include (or may be made of) an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chromium (Cr), tantalum (Ta), and/or titanium (Ti).

The metal member MM is provided on the first electrode EL1. The metal member MM has an opening OPN for accommodating the bar-type LED LD. The metal member MM may expose the lower first electrode EL1 through the opening OPN.

When the opening OPN is viewed in a cross-sectional view (see, e.g., FIG. 5B), the opening OPN has a shape in which the width of its inside portion is greater than that of its entrance (or upper portion). Accordingly, the bar-type LED LD can be more stably accommodated in the metal member MM, and separation of the bar-type LED LD may be prevented.

In some embodiments, when viewed on a plane, the opening OPN may have a circular or elliptical shape as shown in FIG. 5A. However, the shape of the opening OPN is not limited thereto and may be variously suitably modified.

In addition, when viewed on a plane, the metal member MM may be formed to cover the first electrode EL1, but the planar size and shape of the metal member MM are not limited.

The thickness of the metal member MM may be less than the length of the bar-type LED LD to ensure a light emission region by exposing a second end portion LDb of the bar-type LED LD. Therefore, the thickness of the metal member MM and the size of the opening OPN may be determined such that a first end portion LDa of the bar-type LED LD extends into the opening OPN and the second end portion LDb is exposed to the outside (e.g., is outside of the opening OPN).

The metal member MM includes (or is formed of) a conductive metal material and may be a metal that facilitates wet etching. The opening OPN in the metal member MM may be formed through an isotropic etching process using a chemical solution. A method of forming the opening OPN will be further described later.

The material of the metal member MM may include (or may be) an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chromium (Cr), tantalum (Ta), and/or titanium (Ti). When the metal member MM and the alignment lines AW1 and AW2 are made of the same material, the metal member MM and the alignment lines AW1 and AW2 may be concurrently (or simultaneously) formed.

The first insulating layer INS1 is provided over the metal member MM. For example, the first insulating layer INS covers a front surface (e.g., an upper surface) of the substrate SUB on which the first electrode EL1, the alignment lines AW1 and AW2, and the metal member MM are formed. A portion of the first insulating layer INS1 is removed such that the opening OPN in the metal member MM is exposed.

The first insulating layer INS1 has an inclined surface SLP which is inclined with respect to the opening OPN (e.g., which is inclined with respect to the upper surface of the substrate SUB). For example, when viewed as a cross-section, a region of the first insulating layer INS1 that is around the opening OPN may have a funnel shape as shown in FIG. 5B. The inclination angle of the inclined surface SLP may be variously determined according to the size of the bar-type LED LD and the structure (e.g., the size and/or shape) of the opening OPN in the metal member MM.

The first insulating layer INS1 may be an organic insulating layer including (or made of) an organic material. The organic material may include an organic insulating material, such as a polyacryl-based compound, a polyimide-based compound, a fluorine-based compound, such as Teflon° (a registered trademark of The Chemours Company of Wilmington, Del.), or a benzocyclobutene-based compound.

The bar-type LED LD is electrically connected to the first electrode EL1 at the first end portion LDa of the bar-type LED LD, which is in the opening OPN. The bar-type LED LD is also electrically connected to the second electrode EL2 provided at the second end portion LDb of the bar-type LED LD, which protrudes outside of the opening OPN. The bar-type LED LD may be inserted into the opening OPN using a method of spraying an LED solution including a plurality of bar-type LED LD onto the substrate SUB on which the first insulating layer INS is formed. A portion of the insulating film may be removed before the spraying of the LED solution at where the first end portion LDa of the bar-type LEDs LD are to be accommodated.

The bar-type LED LD extends into the opening OPN and may be aligned to lean obliquely onto the inclined surface SLP of the first insulating layer INS1. Here, the aligning direction of the bar-type LED LD may be determined by the polarity of a voltage applied to the alignment lines AW1 and AW2. For example, when a voltage having a positive polarity (+) is applied to the first alignment line AW1 and a voltage having a negative polarity (−) is applied to the second alignment line AW2, the first end portion LDa of the bar-type LED may face the first alignment line AW1 and the second end portion LDb of the bar-type LED may face the second alignment line AW2. Here, the first end portion LDa of the bar-type LED LD may be an anode electrode, and the second end portion LDb of the bar-type LED LD may be a cathode electrode.

In FIGS. 5A and 5B, an embodiment in which one bar-type LED LD is in one opening OPN is described as an example. In another embodiment, a plurality of bar-type LEDs LD may be inserted into one opening OPN.

The connecting member CM is provided between the first end portion LDa of the bar-type LED that is in the opening OPN and the first electrode EL1. The connecting member CM includes (or is formed of) a conductive material and increases the electrical contact area between the bar-type LED LD and the first electrode EL1.

Also, because the connecting member CM is adjacent to the light emission region of the bar-type LED LD, the connecting member CM may include (or may be formed of) a transparent conductive material. For example, the connecting member CM may include (or may be made of) a transparent conductive material, such as Indium Tin Oxide (ITO), Indium Zinc Oxide (IZO), or Antimony Zinc Oxide (AZO). Light emitted from the bar-type LED LD (e.g., light emitted from a portion of the bar-type LED LD near the first end portion LDa) may be transmitted through the connecting member CM and reflected by the metal member MM in the opening OPN.

The connecting member CM may be formed using a method of depositing a conductive material on the front surface of the substrate SUB and in the opening OPN and then wet-etching the conductive material such that some of the conductive material remains in the opening OPN. A method of forming the connecting member CM will be further described later.

The second insulating layer INS2 is provided on the first insulating layer INS1. The second insulating layer INS2 has a contact opening (e.g., a contact hole) CNT for electrical connection between the second end portion LDb of the bar-type LED LD and the second electrode EL2. A portion of the insulating film of the bar-type LED LD may be removed while dry etching is being performed to form the contact opening CNT.

The second insulating layer INS2 may be an inorganic insulating layer including (or made of) an inorganic material. The organic material may include inorganic insulating materials, such as polysiloxane, silicon nitride, silicon oxide, and silicon oxynitride.

The second electrode EL2 is provided on the second insulating layer INS2. The second electrode EL2 is connected to the second end portion LDb of the bar-type LED LD through the contact opening CNT in the second insulating layer INS2. The second electrode EL2 may include (or may be made of) a metal. For example, the second electrode EL2 may include (or may be made of) at least one of a metal, such as gold (Au), silver (Ag), aluminum (Al), molybdenum (Mo), chromium (Cr), titanium (Ti), nickel (Ni), neodymium (Nd), and copper (Cu), or alloys of these metals. When the second electrode EL2 includes (or is made of) a metal, the second electrode EL2 may be formed very thin or may be formed in a mesh structure to allow light to be transmitted therethrough.

Figure 6:
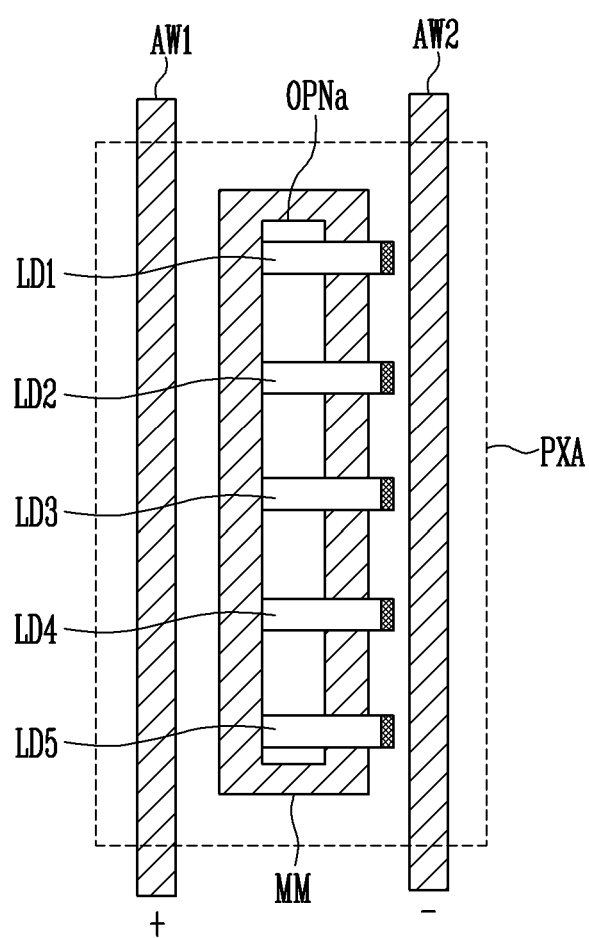
FIGS. 6 and 7 are plan views illustrating pixel regions of light emitting devices according to other embodiments of the present disclosure.
Figure 7:
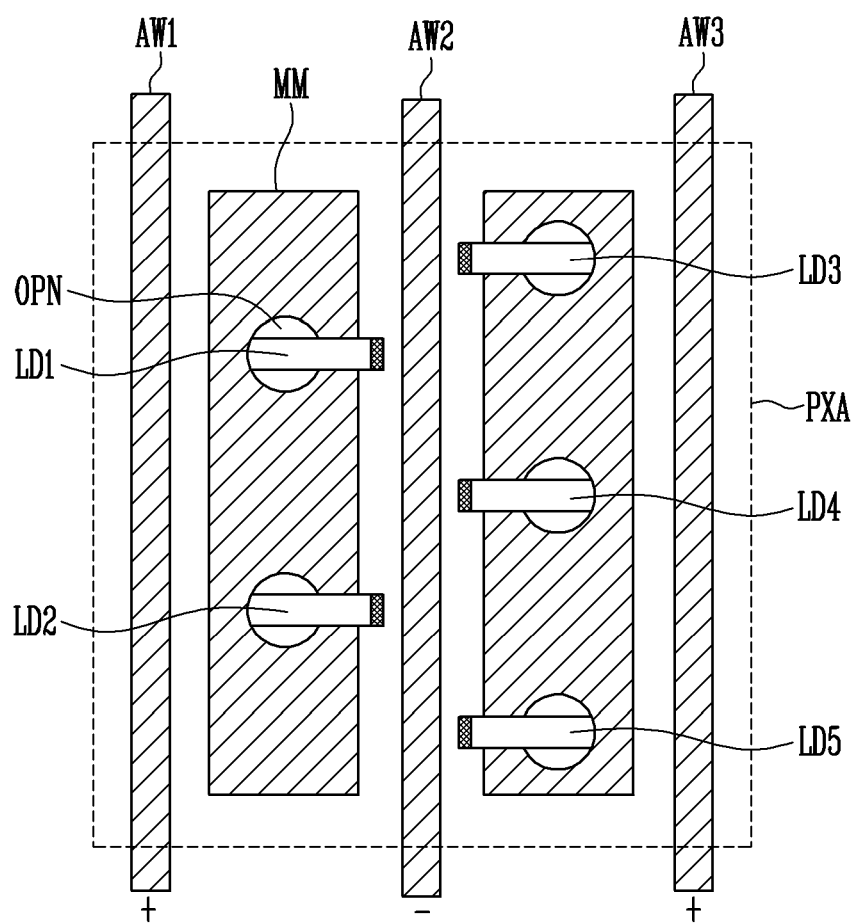

FIGS. 6 and 7 are plan views illustrating pixel regions of light emitting devices according to other embodiments of the present disclosure. Components having the same reference numerals as those described above may refer to the aforementioned disclosure and overlapping or repeated descriptions thereof may be omitted.

Referring to FIG. 6, a metal member MM of a light emitting device according to another embodiment of the present disclosure has an opening OPNa for accommodating a plurality of bar-type LEDs LD1 to LD5. When viewed on a plane, the opening OPNa may have a rectangular shape such that the bar-type LEDs LD1 to LD5 are inserted and arranged in one direction.

Referring to FIG. 7, in a light emitting device according to another embodiment of the present disclosure, bar-type LEDs LD1 to LD5 may be aligned in a pixel region PXA to be inclined in directions opposite to each other. When a voltage having a positive polarity (+) is applied to a first alignment line AW1 and a third alignment line AW3 and a voltage having a negative polarity (−) is applied to a second alignment line AW2, first and second bar-type LEDs LD1 and LD2 and third, fourth, and fifth bar-type LEDs LD3, LD4, and LD5 may be aligned in directions opposite to each other.

As described above, the light emitting uniformity of the light emitting device may be improved using an alternating arrangement alignment method in which bar-type LEDs LD1 to LD5 in one pixel region PXA are aligned in directions different from each other.

FIGS. 8A-8K are sectional views sequentially illustrating a fabricating method of the light emitting device according to an embodiment of the present disclosure. Components having the same reference numerals as those described above may refer to the aforementioned disclosure and overlapping or repeated description thereof may be omitted.

Figure 8A:
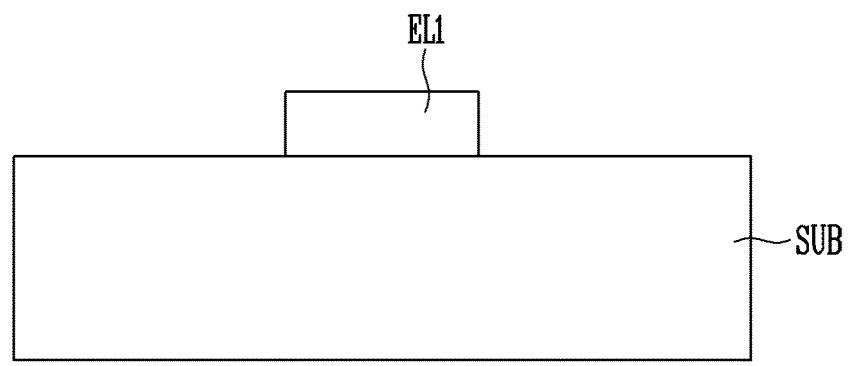
FIGS. 8A-8K are sectional views sequentially illustrating a fabricating method of the light emitting device according to an embodiment of the present disclosure.

Referring to FIG. 8A, a first electrode EL1 is formed on a substrate SUB. The first electrode EL1 may be formed by depositing a material of the first electrode EL1 on the substrate SUB and then patterning the deposited material. A photolithography process and an etching process may be performed to pattern the first electrode EU.

Figure 8B:
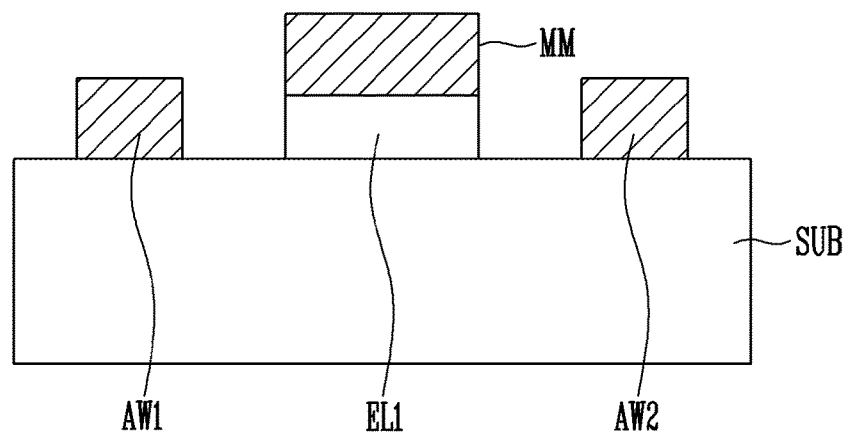

Referring to FIG. 8B, a metal member MM and alignment lines AW1 and AW2 are formed on the substrate SUB on which the first electrode EL1 is formed. The metal member MM is formed on the first electrode EL1, and a first alignment line AW1 and a second alignment line AW2 are formed at opposite sides of the first electrode EL1 (e.g., are formed at one side and another side of the first electrode EL1, respectively). The thickness of the metal member MM may be less than the length of a bar-type LED LD such that a portion of (e.g., only a portion or less than all of) the bar-type LED LD can be accommodated in the metal member MM.

An embodiment in which the metal member MM and the alignment lines AW1 and AW2 are concurrently (or simultaneously) formed of the same material is illustrated as an example, but the metal member MM and the alignment lines AW1 and AW2 may be formed of different materials through different processes.

Figure 8C:
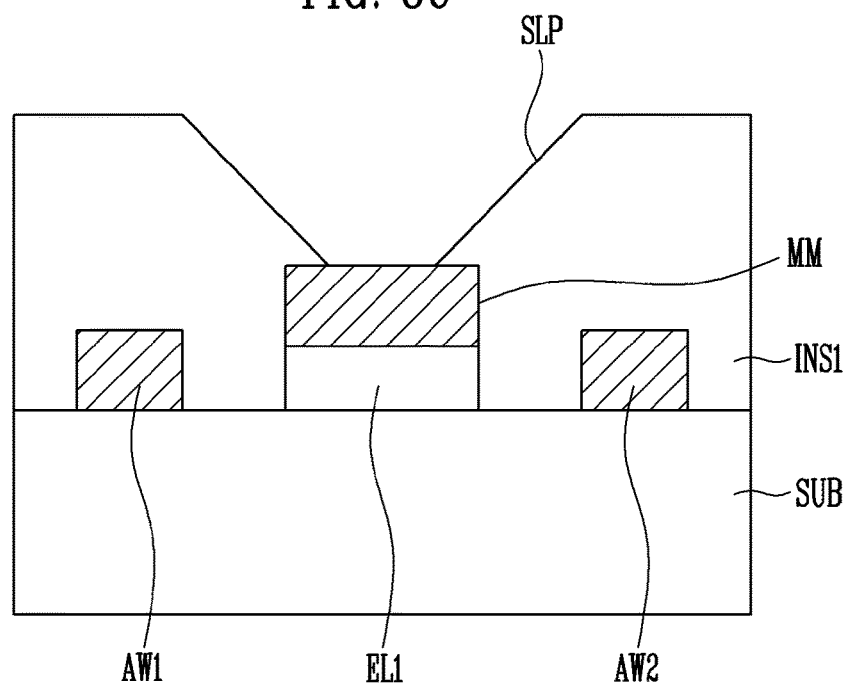

Referring to FIG. 8C, a first insulating layer INS1 is formed over the metal member MM. Here, a portion of the first insulating layer INS1 is removed such that the metal member MM (e.g., such that a portion of the metal member MM) is exposed therethrough. The first insulating layer INS1 may be an organic insulating layer including (or made of) an organic material. The organic material may include an organic insulating material, such as a polyacryl-based compound, a polyimide-based compound, a fluorine-based compound, such as Teflon° (a registered trademark of The Chemours Company of Wilmington, Del.), or a benzocyclobutene-based compound.

Here, the first insulating layer INS1 may be formed to have an inclined surface SLP that is inclined with respect to the metal member MM. The inclined surface SLP may be formed by depositing a material of the first insulating layer INS1 on the substrate SUB and then patterning the deposited material. A photolithography process and an etching process may be performed to pattern the inclined surface SLP.

Figure 8D:
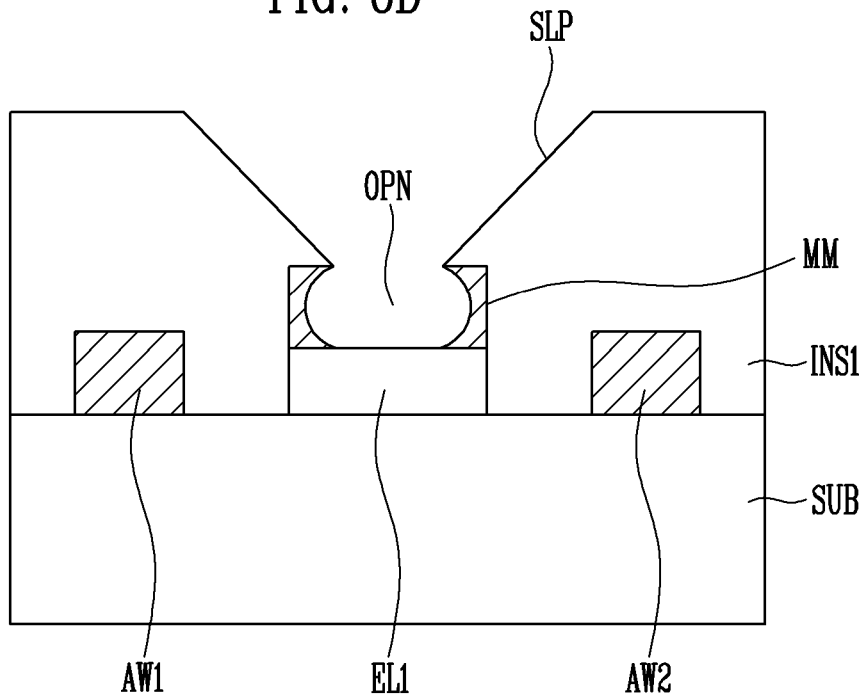

Referring to FIG. 8D, after the first insulating layer INS1 is formed, an opening OPN is formed in the exposed metal member MM. When a cross-section of the opening OPN is viewed, the opening OPN has a shape in which the width of its inside portion is greater than that of its entrance. Thus, the bar-type LED LD that is accommodated in the metal member MM may not be easily separated from the metal member MM.

The opening OPN may be formed through a wet etching process using a chemical solution. The wet etching process is an isotropic etching process and may allow the opening OPN to have a shape in which the width of its inside portion is greater than that of its entrance.

Figure 8E:
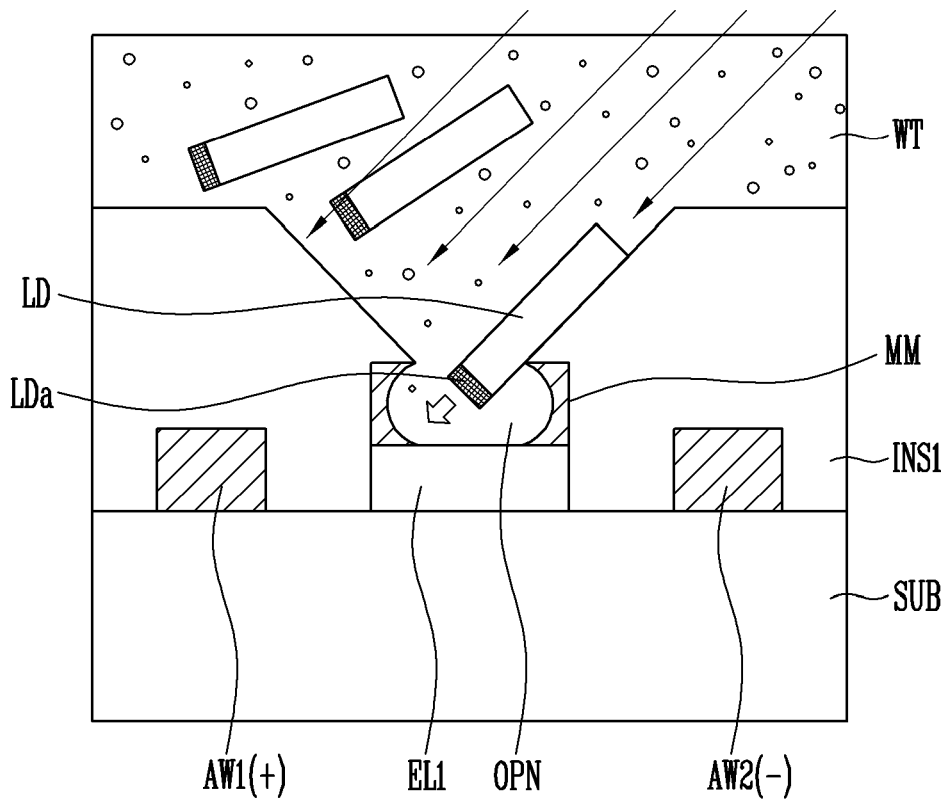
Figure 8F:
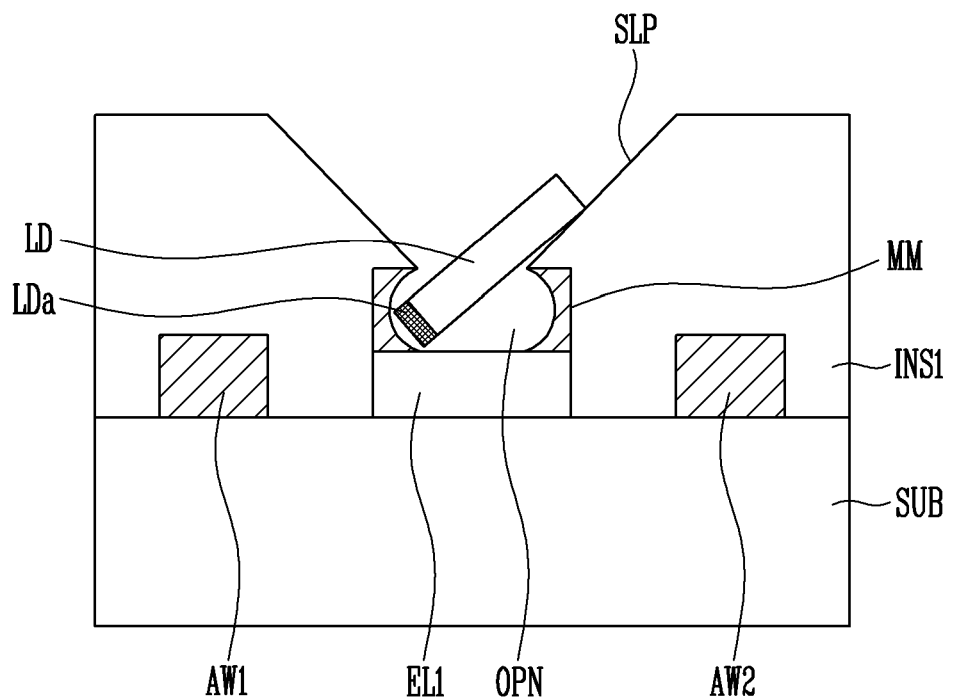

Referring to FIGS. 8E and 8F, bar-type LEDs LD are arranged to be inserted into the opening OPN. For example, an LED solution including a plurality of bar-type LEDs LD is coated on the first insulating layer INS1. After the LED solution is coated or at the same or substantially the same time as when the LED solution is coated, an electric field is formed by applying a voltage to the alignment lines AW1 and AW2 to induce self-alignment of the randomly distributed bar-type LEDs LD.

In addition, as shown in FIG. 8E, bar-type LEDs LD may be inserted into the opening OPN using a method of cleaning the substrate having the LED solution provided thereon in one direction using a cleaning solution WT. Here, some of the plurality of bar-type LEDs LD in the LED solution are inserted into the opening OPN and the others of the plurality of bar-type LEDs LD may be removed through the cleaning process.

In another embodiment, the bar-type LEDs LD may be inserted into the opening OPN by independently spraying the LED solution or spraying the LED solution together with the cleaning solution WT.

Therefore, as shown in FIG. 8F, the bar-type LED may be aligned to lean obliquely onto the inclined surface SLP of the first insulating layer INS1. In addition, the bar-type LED LD is electrically connected to the first electrode EL1 when the first end portion LDa of the bar-type LED LD is in the opening OPN.

Figure 8G:
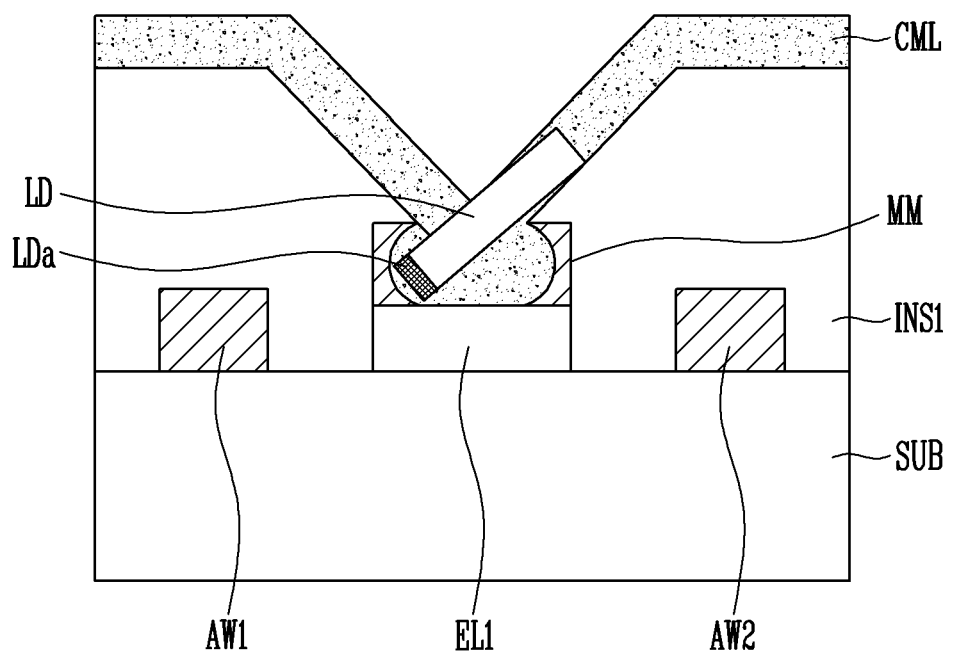
Figure 8H:
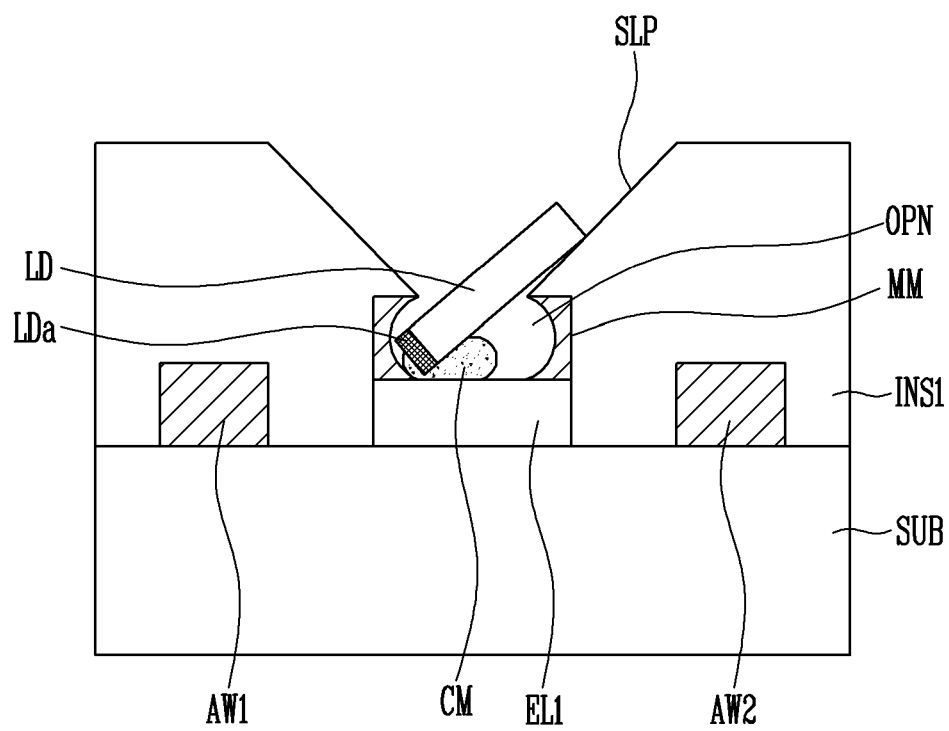

Referring to FIGS. 8G and 8H, a connecting member CM, which is provided between the first end portion LDa of the bar-type LED LD in the opening OPN, and the first electrode EL1 may be formed. The connecting member CM includes (or is formed of) a conductive material and increases the electrical contact area between the bar-type LED LD and the first electrode EL1. In some embodiments, the connecting member CM may include (or may be made of) a transparent conductive material, such as Indium Tin Oxide (ITO), Indium Zinc Oxide (IZO) or Antimony Zinc Oxide (AZO).

A connecting member layer CML is formed on the first insulating layer INS1. For example, the connecting member layer CML may be deposited on the front surface of the substrate SUB to be filled in the opening OPN. Then, the connecting member layer CML is etched such that a portion of the connecting member layer CML remains in the opening OPN. For example, a portion of the connecting member layer CML in the opening OPN, which overlaps the bar-type LED LD, may remain (e.g., may not be etched). A wet etching process may be used as the etching process of the connecting member layer CML.

Figure 8I:
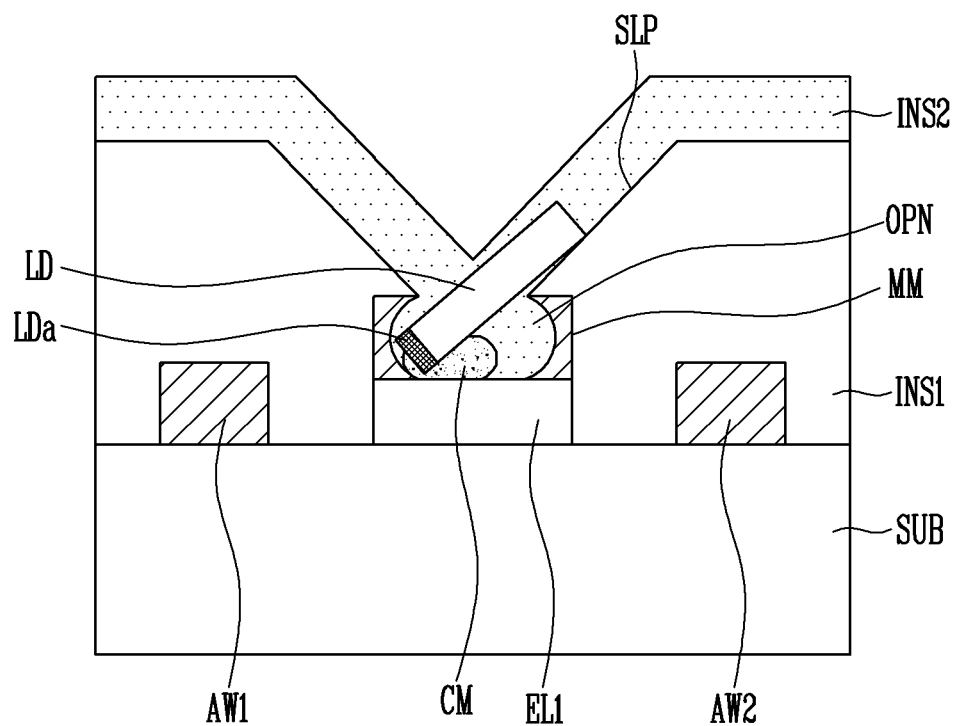
Figure 8J:
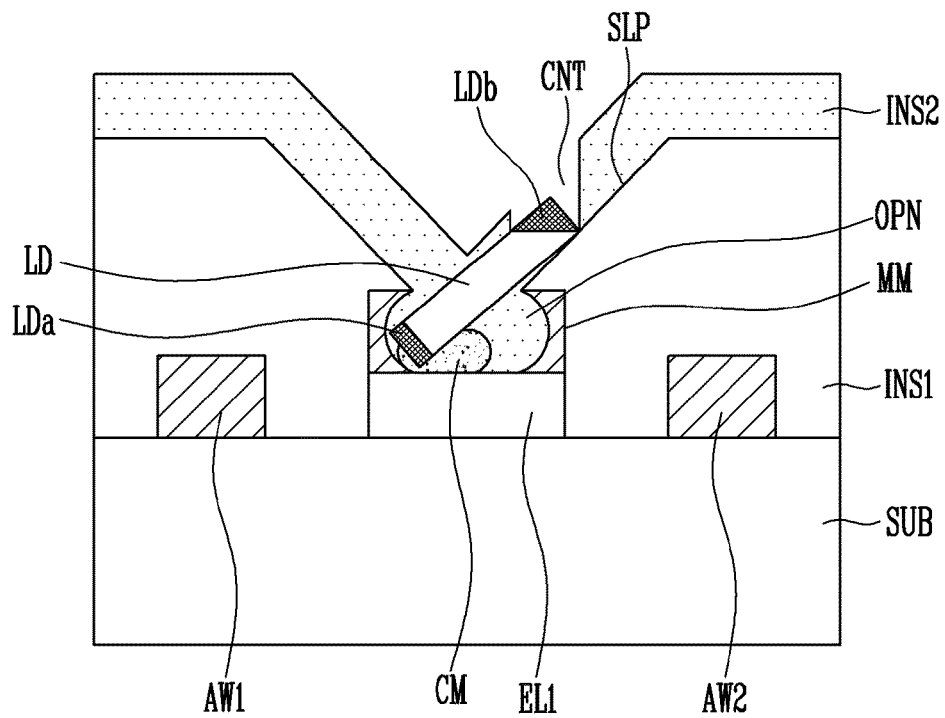

Referring to FIGS. 8I and 8J, a second insulating layer INS2 is formed on the first insulating layer INS1. The second insulating layer INS2 may be an inorganic insulating layer including (or made of) an inorganic material. The organic material may include inorganic insulating materials, such as polysiloxane, silicon nitride, silicon oxide, and silicon oxynitride.

A material of the second insulating layer INS2 is deposited on the first insulating layer INS1. Then, a contact opening CNT is patterned at a position corresponding to the bar-type LED LD. A portion of the insulating film of the bar-type LED LD may be removed while dry etching is being performed to form the contact opening CNT.

Figure 8K:
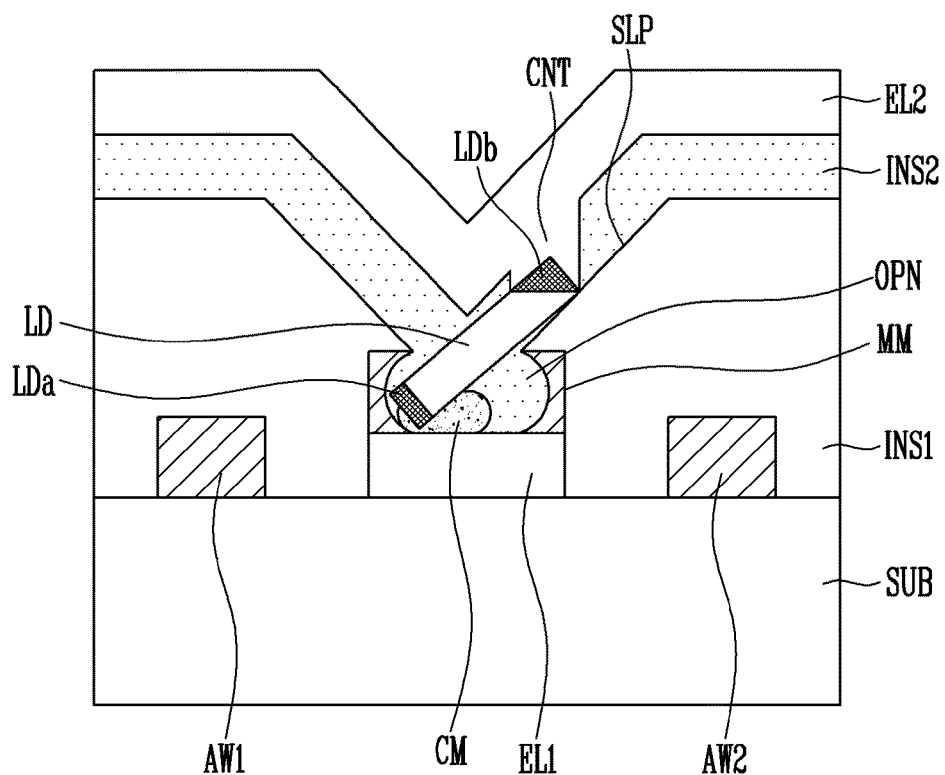

Referring to FIG. 8K, a second electrode EL2 is formed on the second insulating layer INS2. The second electrode EL2 is electrically connected to a second end portion LDb of the bar-type LED LD through the contact opening CNT, which passes through the second insulating layer INS2.

The second electrode EL2 may include (or may be made of) a metal. For example, the second electrode EL2 may include (or may be made of) at least one of a metal, such as gold (Au), silver (Ag), aluminum (Al), molybdenum (Mo), chromium (Cr), titanium (Ti), nickel (Ni), neodymium (Nd), and copper (Cu), or alloys of these metals. Also, the second electrode EL2 may be formed as a single layer. However, the present disclosure is not limited thereto, and the second electrode EL2 may be formed as a multi-layer structure in which a plurality of materials from among the metals and the alloys are stacked.

As described above, according to embodiments of the present disclosure, the metal member MM having the opening OPN is provided on the first electrode EL1, and one end portion of the bar-type LED LD is inserted into the opening OPN so that bar-type LEDs LD can be more uniformly arranged. Accordingly, the light emitting uniformity of the light emitting device is improved.

Example embodiments of the present disclosure have been disclosed herein, and although specific terms are employed, they are used and are to be interpreted in a generic and descriptive sense only and not for purpose of limitation. In some instances, as would be apparent to one of ordinary skill in the art as of the effective filing date of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made to the described example embodiments without departing from the spirit and scope of the present disclosure as set forth in the following claims and their equivalents.

What is claimed is:

1. A light emitting device comprising:
   a substrate;
   a first electrode on the substrate;
   a metal member on the first electrode, the metal member having a cavity;
   a first insulating layer on the metal member, the first insulating layer exposing the cavity therethrough;
   a bar-type LED having a first end portion and a second end portion, the first end portion being electrically connected to the first electrode in the cavity, the second end portion protruding outside of the cavity; and
   a second electrode on the first insulating layer, the second electrode being connected to the second end portion of the bar-type LED.

2. The light emitting device of claim 1, wherein a width of an inside portion of the cavity is greater than a width of an entrance to the cavity.

3. The light emitting device of claim 1, wherein a thickness of the metal member is less than a length of the bar-type LED.

4. The light emitting device of claim 1, wherein the cavity in the metal member exposes the first electrode.

5. The light emitting device of claim 1, further comprising a plurality of bar-type LEDs in the cavity.

6. The light emitting device of claim 1, wherein the first insulating layer has an inclined surface inclined with respect to the cavity, and
   wherein the bar-type LED leans obliquely onto the inclined surface of the first insulating layer.

7. The light emitting device of claim 6, wherein one pixel region comprises a plurality of bar-type LEDs, and
   wherein the bar-type LEDs in the one pixel region are inclined in the same direction.

8. The light emitting device of claim 6, wherein one pixel region comprises a plurality of bar-type LEDs, and
   wherein the bar-type LEDs in the one pixel region are inclined in directions different from each other.

9. The light emitting device of claim 1, further comprising a connecting member between the first end portion of the bar-type LED in the cavity and the first electrode.

10. The light emitting device of claim 1, further comprising a second insulating layer between the first insulating layer and the second electrode,
    wherein the second insulating layer has a contact opening at where the second end portion of the bar-type LED and the second electrode are electrically connected to each other.

11. The light emitting device of claim 1, further comprising alignment lines at both sides of the first electrode.

12. A method of fabricating a light emitting device, the method comprising:
    forming a first electrode on a substrate;
    forming a metal member on the first electrode;
    forming a first insulating layer over the metal member,
    removing a portion of the first insulating layer to expose the metal member;
    forming a cavity in the metal member;

arranging a bar-type LED such that a first end portion of the bar-type LED is in the cavity and electrically connected to the first electrode; and forming a second electrode on the first insulating layer, the second electrode being electrically connected to a second end portion of the bar-type LED.

13. The method of claim 12, wherein the cavity in the metal member has a shape in which a width of its inside portion is larger than a width of its entrance.

14. The method of claim 13, wherein the cavity is formed by isotropic etching.

15. The method of claim 12, wherein a thickness of the metal member is less than a length of the bar-type LED.

16. The method of claim 12, wherein the first insulating layer has an inclined surface inclined with respect to the cavity, and wherein the bar-type LED leans obliquely onto the inclined surface of the first insulating layer.

17. The method of claim 12, wherein the arranging of the bar-type LED comprises:

providing an LED solution comprising a plurality of bar-type LEDs on the first insulating layer; and after the providing the LED solution, cleaning the substrate in one direction.

18. The method of claim 12, further comprising forming a connecting member between the first end portion of the bar-type LED that is in the cavity and the first electrode.

19. The method of claim 18, wherein the forming of the connecting member comprises:

forming a connecting member layer on the first insulating layer and in the cavity; and etching the connecting member layer such that a portion of the connecting member layer remains in the cavity.

20. The method of claim 12, further comprising forming a second insulating layer having a contact opening on the first insulating layer, the second end portion of the bar-type LED and the second electrode being electrically connected to each other at the contact opening.

* * * * *